(12) United States Patent
Lin (10) Patent No.: US 6,476,449 B1
(45) Date of Patent: Nov. 5, 2002

(54) SILICIDE BLOCK FOR ESD PROTECTION DEVICES

(75) Inventor: Shi-Tron Lin, Taipei (TW)

(73) Assignee: Winbond Electronics Corp. (TW)

(*) Notice: Subject to any disclaimer, the term of this patent is extended or adjusted under 35 U.S.C. 154(b) by 0 days.

(21) Appl. No.: 09/946,188

(22) Filed: Sep. 5, 2001

(51) Int. Cl.⁷ .................. H01L 23/62; H01L 29/76; H01L 29/94; H01L 31/062; H01L 31/113
(52) U.S. Cl. .................. 257/360; 257/384; 257/401
(58) Field of Search .................. 257/360, 382, 257/384, 401

(56) References Cited

U.S. PATENT DOCUMENTS

| | | |
|---|---|---|
| 5,248,892 A | 9/1993 | Van Roozendaal et al. |
| 5,283,499 A | 2/1994 | Adam et al. |
| 5,721,439 A | 2/1998 | Lin |
| 5,937,298 A | 8/1999 | Hung et al. |
| 5,973,363 A | 10/1999 | Staab et al. |
| 5,973,382 A | 10/1999 | Burgener et al. |
| 6,046,087 A | 4/2000 | Lin et al. |
| 6,057,555 A | 5/2000 | Reedy et al. |
| 6,064,095 A | 5/2000 | Fu |
| 6,153,913 A | 11/2000 | Hsu |
| 6,157,065 A | 12/2000 | Huang et al. |
| 6,215,156 B1 | 4/2001 | Yang |
| 6,225,166 B1 | 5/2001 | Hsu et al. |
| 6,236,073 B1 | 5/2001 | Hsu |
| 6,323,561 B1 * | 11/2001 | Gardner et al. ............. 257/900 |

OTHER PUBLICATIONS

US 6,351,012, 2/2002, Hirata (withdrawn)*

* cited by examiner

Primary Examiner—Ngân V. Ngô
(74) Attorney, Agent, or Firm—Raymond Sun (57) ABSTRACT

A semiconductor device has a first diffusion region having a silicided portion and a non-silicided portion. The device also has a second diffusion region, and a channel region between the first and second diffusion regions. The non-silicided portion of the first diffusion region has a plurality of non-silicided regions.

22 Claims, 11 Drawing Sheets

SILICIDE BLOCK FOR ESD PROTECTION DEVICES

BACKGROUND OF THE INVENTION

1. Field of the Invention

The present invention relates to improved silicide blocks for semiconductor devices, and in particular, to silicide-blocking processes, masks, and silicide-blocked device structures, that improve electro-static discharge (ESD) protection in semiconductor integrated circuit (IC) devices.

2. Background Art

The silicide block has been widely used to create a portion of non-silicided surface in an otherwise silicided diffusion region of a MOS transistor. The silicide block is known to improve, to a certain extent, the ESD performance of a silicide (or salicide) NMOS. The non-silicide region typically represents a high sheet resistance region, and the silicide region represents a low sheet resistance region. The silicide and non-silicide regions are typically formed by photo processing through a patterned silicide/salicide block mask, followed by photo etching and certain metal etching and annealing processes.

Figure 1:
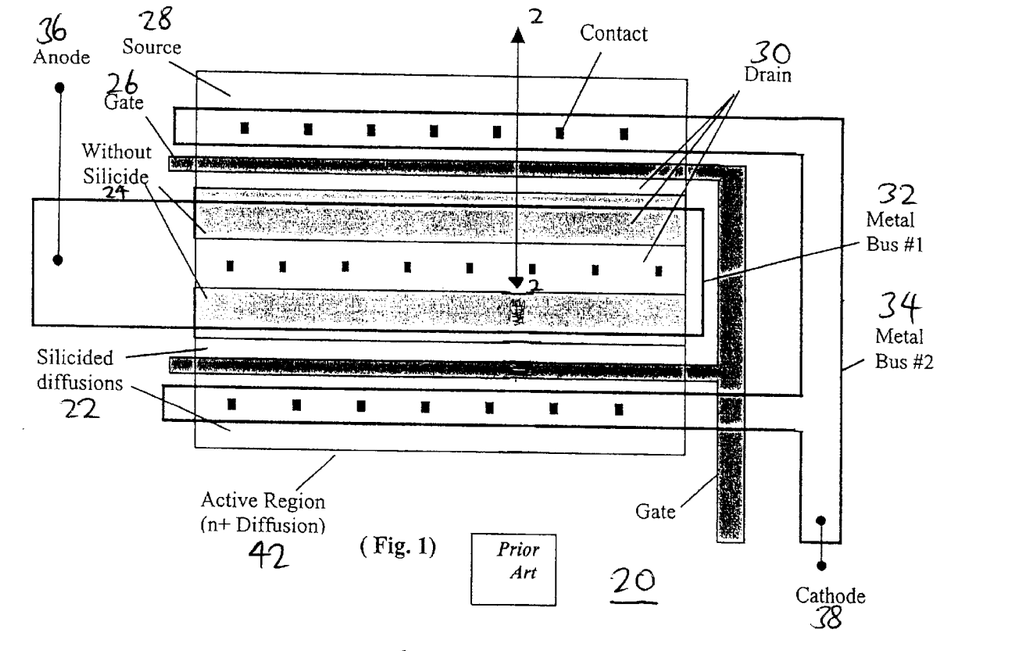
FIG. 1 is a schematic top view of a conventional NMOS transistor.
Figure 2:
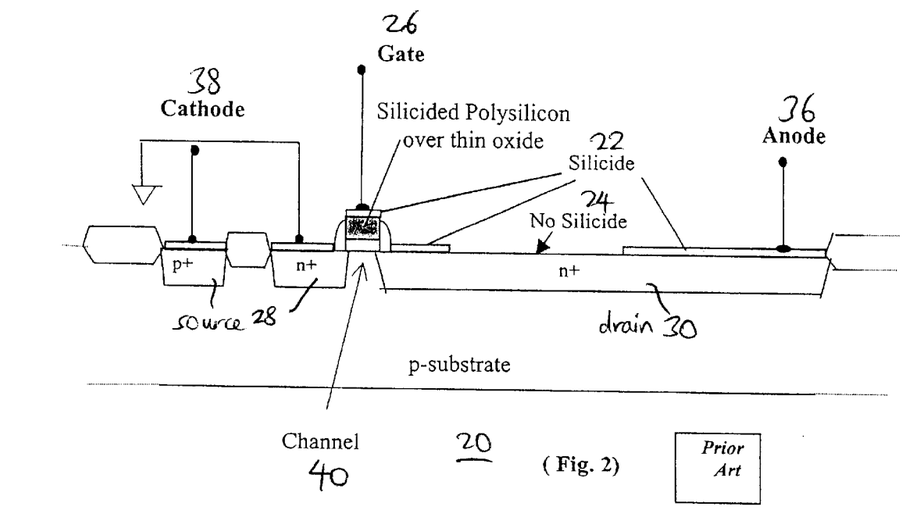
FIG. 2 is a cross-sectional view of the circuit of FIG. 1 taken line 2—2 thereof.

FIGS. 1 and 2 illustrate a conventional NMOS transistor 20 having a silicided source/drain (S/D) diffusion 22, and strips of non-silicided diffusion 24 that are processed by a silicide block mask. In particular, there is a polysilicon gate 26, a first diffusion (e.g., source) region 28 and a second diffusion (e.g., drain) region 30, with a first metal bus 32 extending in the drain region 30 and a second metal bus 34 extending in the source region 28. An anode 36 is coupled to the first metal bus 32 and a cathode 38 is coupled to the second metal bus 34. A channel 40 is defined between the diffusion regions 28 and 30.

Figure 3:
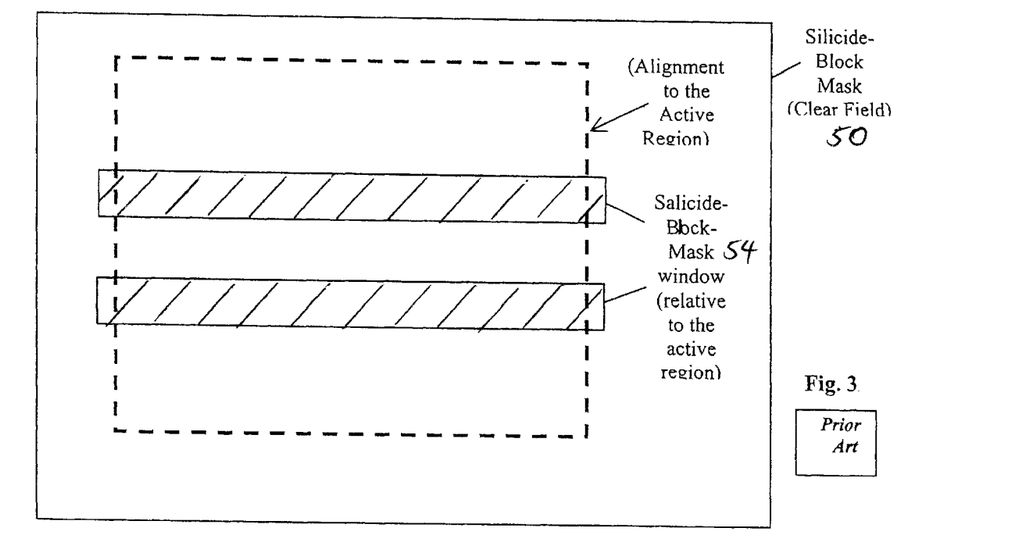
FIG. 3 illustrates a conventional silicide-block mask in clear field.
Figure 4:
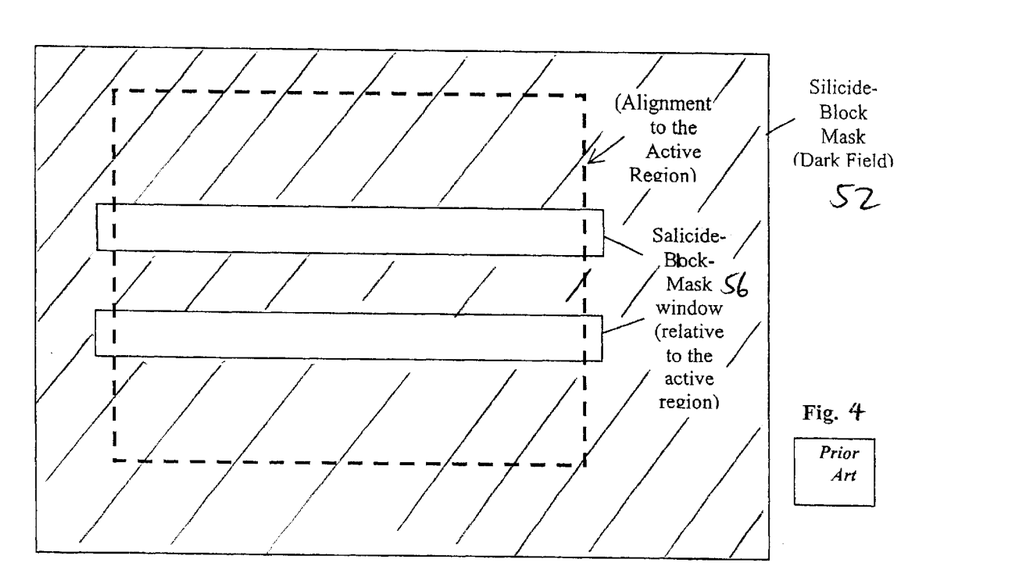
FIG. 4 illustrates a conventional silicide-block mask in dark field.

FIG. 3 illustrates a conventional silicide-block mask 50 in clear field, and FIG. 4 illustrates a conventional silicide-block mask 52 in dark field. The mask 50 in FIG. 3 is suitable for metal (e.g., titanium) etching with a first type of (e.g., positive or negative) photoresist, while the mask 52 in FIG. 4 is suitable for metal (e.g., titanium) etching with a second type of (e.g., negative or positive) photoresist. Each mask 50 and 52 has respective salicide block mask windows 54 and 56 that is positioned relative to the active region 42 of the transistor 20 at the locations where the strips of non-silicided diffusion 24 are to be located. The terms "clear field" and "dark field" refer to the degree of transparency of the field or background of the photo mask 50 or 52. For example, for a contact mask, the photo patterns can be a number of tiny shaped elements which define where the contacts will be located upon alignment with the wafer by a photo (e.g., exposure or etching) process. If the contact (photo) mask is clear field, the mask is almost entirely transparent except that the contact patterns (i.e., the shaped elements) will be black. Conversely, if the contact (photo) mask is dark field, the mask appears to be almost entirely black or dark, except that the contact patterns (i.e., the shaped elements) will be transparent and will resemble windows or openings.

In a typical salicide process, both the polysilicon and n+ diffusions have silicided surfaces for high-speed applications. The silicide block can also be used to create a non-silicided surface for polysilicon resistors, so that it is easier to obtain a reasonable-sized polysilicon resistor with desirable resistance. Here, it is known that a salicide (self-aligned silicidation) process typically means that both the diffusion region and the polysilicon gate have silicided surfaces.

Unfortunately, silicide blocks suffer from some drawbacks. For example, the drain resistance is significantly increased (e.g., the silicide-blocked n+ sheet resistance is 30 to 40 ohms per square, versus 2 to 3 ohms per square for silicided diffusion), and the speed of the NMOS transistor is degraded. In addition, the increased drain resistance of an input pad ESD protection device may cause the input-pad transient voltage to build up during an ESD event, so that the internal circuit element may get damaged.

Therefore, there remains a need for an improved silicide block that overcomes the drawbacks set forth above.

SUMMARY OF THE INVENTION

It is an object of the present invention to provide silicided and non-silicided regions in semiconductor processing while overcoming the problems identified above.

It is another object of the present invention to minimize the increase in the drain resistance in silicide or salicide block processing.

It is yet another object of the present invention to provide semiconductor devices that utilize silicide or salicide block processing and which are useful for high-speed (e.g., input, output, I/O) applications.

It is yet another object of the present invention to provide semiconductor devices that utilize silicide or salicide block processing and which provide effective ESD protection.

It is yet another object of the present invention to provide suicide or salicide block processing that is simple to implement.

It is yet another object of the present invention to provide silicide or salicide block processing that only requires one mask change to improve ESD protection and I/O speed.

To accomplish the objectives of the present invention, there is provided a semiconductor device that has a first diffusion region having a silicided portion and a non-silicided portion. The device also has a second diffusion region, and a channel region between the first and second diffusion regions. The non-silicided portion of the first diffusion region has a plurality of non-silicided regions.

According to various embodiments of the present invention, the plurality of non-silicided regions can define at least one silicided path between adjacent non-silicided regions. At least some of the silicided paths can be parallel to each other. The plurality of non-silicided regions can be arranged in separate rows, or they can be arranged in an arbitrary manner. The plurality of non-silicided regions can have different sizes, shapes, and orientations.

According to yet another embodiment of the present invention, the second diffusion region also has a silicided portion and a non-silicided portion, with the non-silicided portion of the second diffusion region having a plurality of non-silicided regions.

BRIEF DESCRIPTION OF THE DRAWINGS

The invention can be more fully understood by reading the subsequent detailed description of the preferred embodiments, with reference made to the accompanying drawings.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known or conventional data processing techniques, hardware devices and circuits are omitted so as to not obscure the description of the present invention with unnecessary detail.

The present invention provides a semiconductor device that has at least one diffusion regions that has a silicided portion and a non-silicided portion. The non-silicided portion of the diffusion region(s) can have a plurality of separated non-silicided regions.

Figure 5:
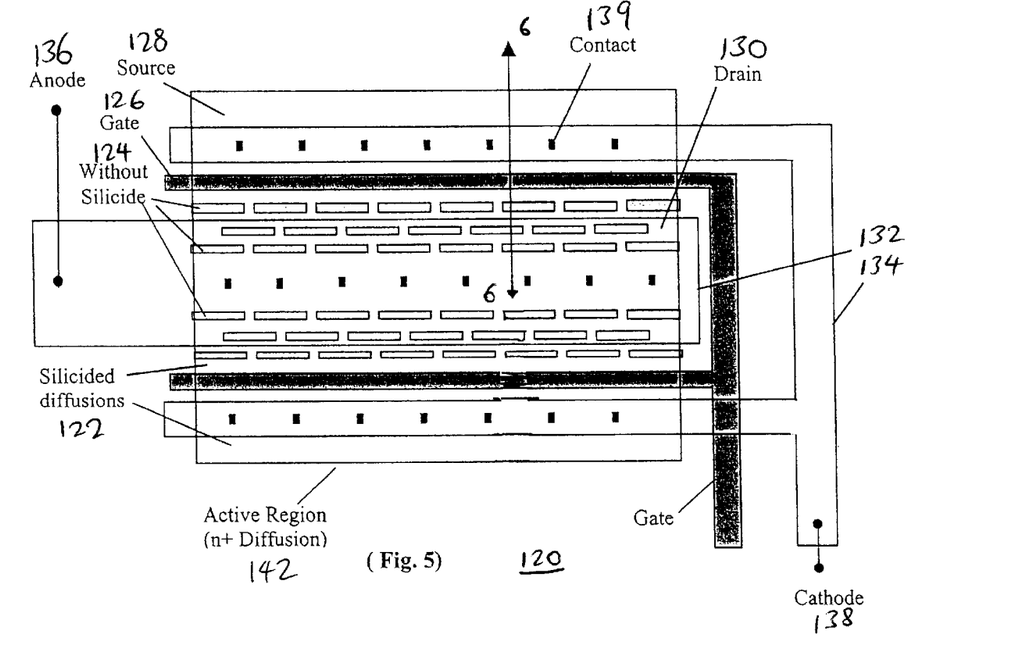
FIG. 5 is a schematic top view of a semiconductor device according to one embodiment of the present invention.
Figure 6:
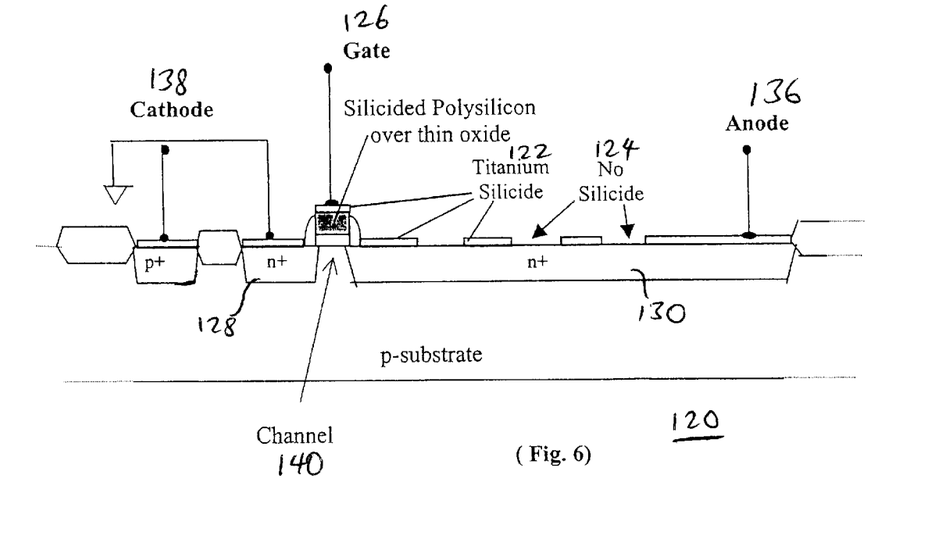
FIG. 6 is a cross-sectional view of the circuit of FIG. 5 taken line 6—6 thereof.

FIGS. 5–6 illustrate one embodiment of the present invention, with a semiconductor device 120 (such as a NMOS transistor) having a drain diffusion with two resistance portions. The device 120 has a silicided source/drain (S/D) diffusion 122 and a non-silicided diffusion region 124 processed by a silicide block mask (as described below). In particular, the polysilicon gate 126 has a first diffusion (e.g., source) region 128 and a second diffusion (e.g., drain) region 130, with a first metal bus 132 extending in the drain region 130 and a second metal bus 134 extending in the source region 128. An anode 136 is coupled to the first metal bus 132 and a cathode 138 is coupled to the second metal bus 134. A channel 140 is defined between the diffusion regions 128 and 130. Contacts 139 can be provided in the second metal bus 134.

The semiconductor device 120 differs from the transistor 20 in FIGS. 1 and 2 in that the non-silicide diffusion region 124 of device 120 is made up of a plurality of separate and individual non-silicide diffusion pieces, as opposed to the single strip non-silicide diffusion region 24 of transistor 20. The provision of separate and individual non-silicide diffusion pieces 124 allows for the design of a variety of different suicide paths, as illustrated in greater detail in connection with the different embodiments of FIGS. 13–14 and 16–18 below. As explained in greater detail below, these different silicide paths provide flexibility in the design of an ESD protection device with silicide and salicide block diffusion regions that avoids the drawbacks set forth hereinabove.

Figure 7:
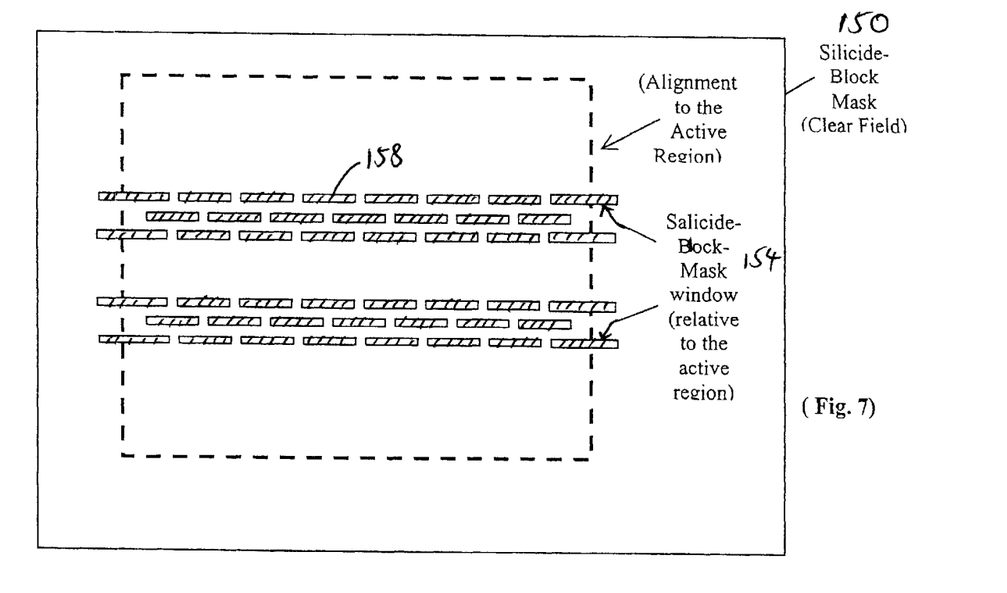
FIGS. 7 and 9 illustrate silicide-block masks in clear field that can be used with the device of FIG. 5.
Figure 8:
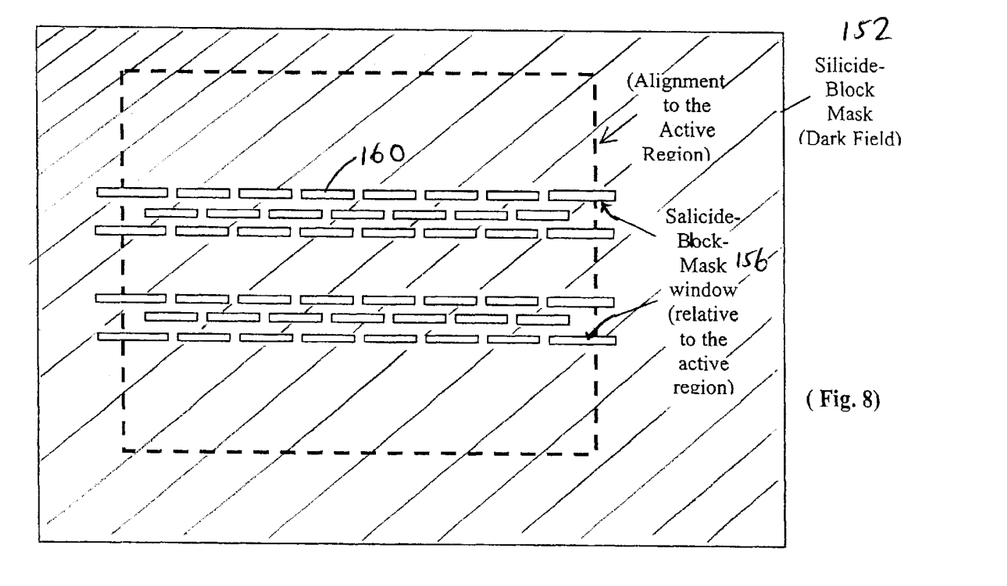
FIGS. 8 and 10 illustrate silicide-block masks in dark field that can be used with the device of FIG. 5.
Figure 9:
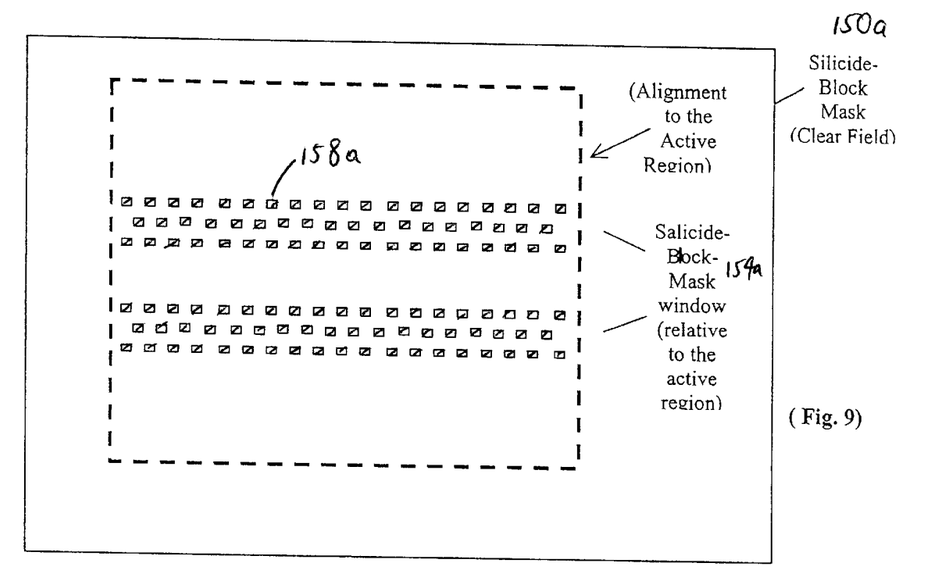
Figure 10:
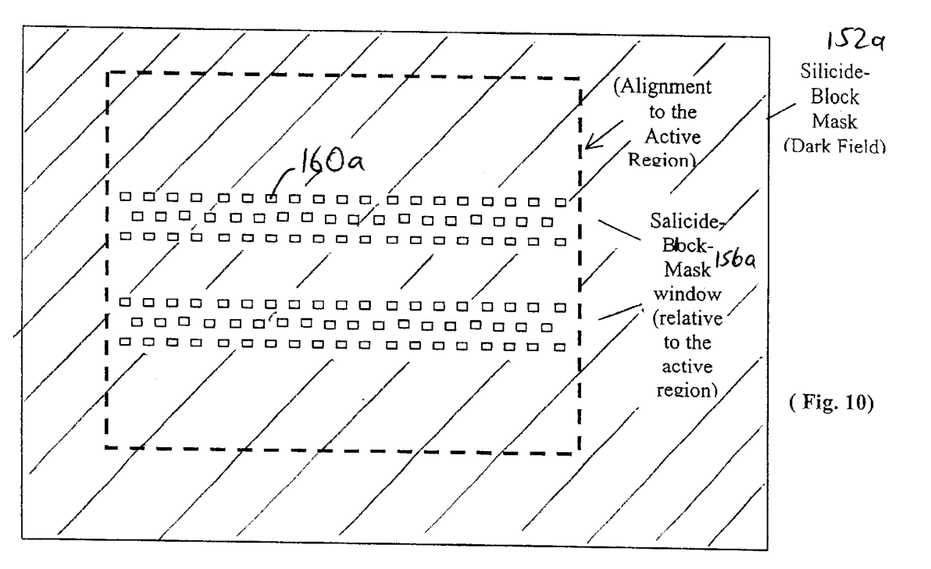

FIG. 7 illustrates a silicide-block mask 150 in clear field, and FIG. 8 illustrates a silicide-block mask 152 in dark field, with both masks 150 and 152 capable of use in connection with forming the non-silicide diffusion region 124. The mask 150 in FIG. 7 is suitable for metal (e.g., titanium) etching with a first type of (e.g., positive or negative) photoresist, while the mask 152 in FIG. 8 is suitable for metal (e.g., titanium) etching with a second type of (e.g., negative or positive) photoresist. The different types of photoresists relate to whether the illuminated or non-illuminated portion(s) of the photoresist will be retained or removed after the photo-development processing. Each mask 150 and 152 has a respective salicide block mask window 154 and 156 that is positioned relative to the active region 142 of the device 120. Each of the windows 154 and 156 includes a plurality of elongated shaped elements 158 and 160, respectively, with each shaped element 158, 160 positioned at the location where one of the plurality of non-silicided diffusion pieces 124 is to be located. The operation principles for the masks 150 and 152 are the same as for the masks 50 and 52 of FIGS. 3 and 4 described above. As an alternative, the plurality of non-silicided diffusion pieces 124 can have a square, rectangular or even an arbitrary configuration instead of an elongated configuration. FIG. 9 illustrates a silicide-block mask 150a in clear field, and FIG. 10 illustrates a silicide-block mask 152a in dark field, with both masks 150a and 152a capable of use in connection with forming a generally square non-silicide diffusion pieces 124. The mask 150a in FIG. 9 is suitable for metal (e.g., titanium) etching with a first type of photoresist, while the mask 152a in FIG. 10 is suitable for metal (e.g., titanium) etching with a second type of photoresist. Each mask 150a and 152a has a respective salicide block mask window 154a and 156a that is positioned relative to the active region 142 of the device 120. Each of the windows 154a and 156a includes a pattern of a plurality of square shaped elements 158a and 160a, respectively, with each shaped element 158a, 160a positioned at the location where one of the plurality of square non-silicided diffusion pieces is to be located.

It is well-known that, after processing, there is corner rounding for a patterned element that is caused by light interference (i.e., diffraction). As the light is projected through a patterned mask onto a wafer, the photo (light) interference causes diffraction of light around the corner of masked patterns. In addition, the etching process can also cause rounding at corners of an etched element. Thus, if the photo patterns in a photo mask are very small (e.g., with a close-to-minimum design rule dimension), the patterned element can appear like a circle or have a rounded configuration after photo and IC processing. This is very common, for example, with the formation of metal contacts.

Figure 11:
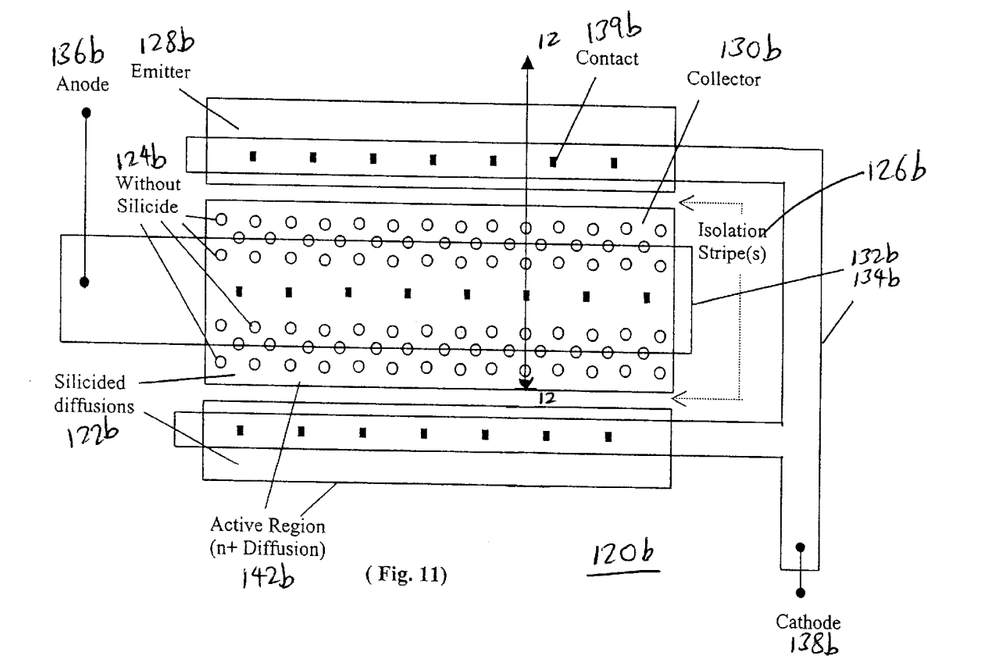
FIG. 11 is a schematic top view of a semiconductor device processed by one of the silicide block mask of either FIG. 9 or FIG. 10.

As a result, if the small square shaped elements 158a, 160a in the masks 150a and 152a of FIGS. 9 and 10, respectively, are used, the patterned non-silicided portion on a diffusion surface can resemble a plurality of separate and individual circles 124b, as shown in FIG. 11. The semiconductor device 120b can be a field device which can function as a lateral bipolar ESD protection device. Such a device typically has a first n+ region coupled to an anode 136b as a collector 130b, a second n+ region coupled to a cathode 138b as an emitter 128b, and a channel region 140b sandwiched between the two n+ regions under an isolation strip 126b (which can be a field-oxide trench or other isolation). The anode 136b can be coupled to a first IC pad (not shown), which can be further coupled to an input pin, an output pin, an I/O pin, or a power-bus pin. The cathode 138b can be coupled to a second IC pad (not shown), which can be further coupled to an input pin, or other types of pins. The plurality of non-silicided diffusion pieces 124b can have a corner-rounded or circular or rectangular configuration instead of a square configuration.

Figure 12:
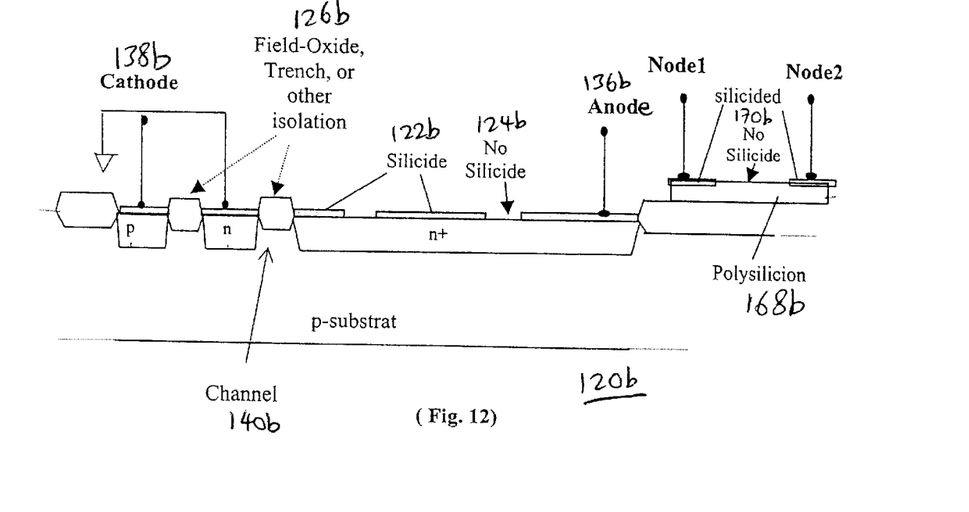
FIG. 12 is a cross-sectional view of a portion of the circuit of FIG. 11 taken line 12—12 thereof, as well as an additional polysilicon resistor.
Figure 15:
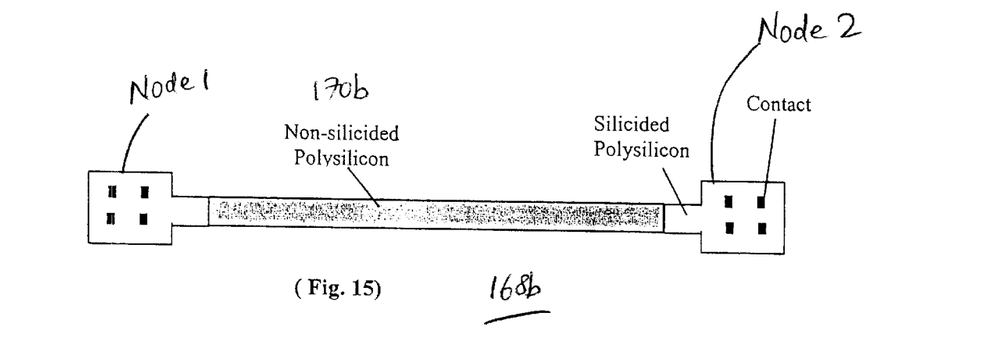
FIG. 15 is a schematic top view of the polysilicon resistor of FIG. 12.

The device 120b in FIG. 12 can also include a polysilicon resistor 168b that is also illustrated in FIG. 15. The polysilicon resistor 168b has a non-silicided surface portion 170b that can be processed by the same salicide block mask 150a or 152a as for the silicide diffusion regions for the device 120b.

FIGS. 13–14 and 16–18 now illustrate different silicide paths that can be provided by different patterns of the separate and individual non-silicide diffusion pieces 124, 124b. As explained below, these different silicide paths and non-silicide patterns can provide different and unique benefits.

Figure 13:
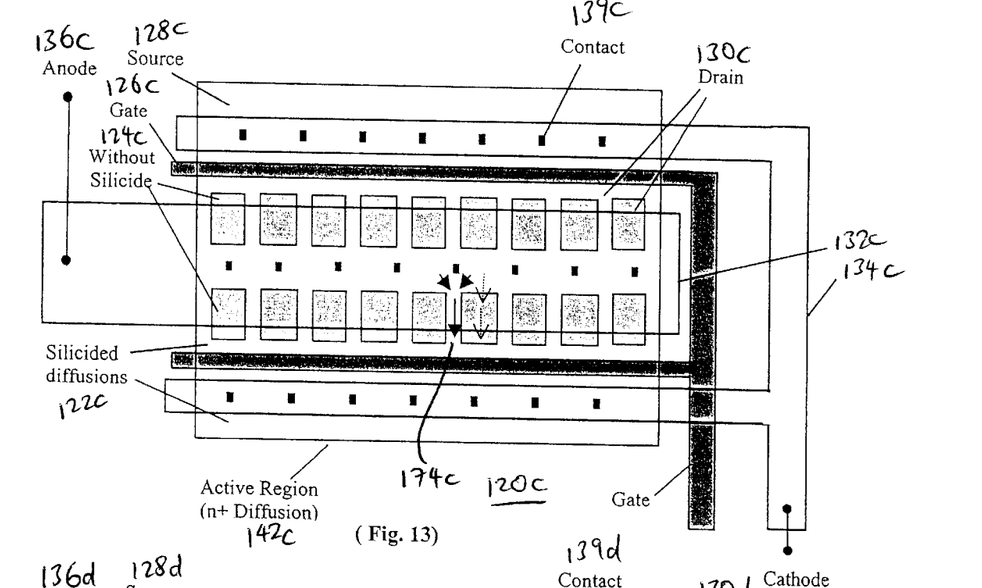
FIGS. 13–14 and 16–18 are schematic top views of semiconductor devices according to different embodiments of the present invention.

Referring first to FIG. 13, the semiconductor device 120c is essentially the same as the semiconductor device 120 of FIG. 5, except that the plurality of separate and individual non-silicide diffusion pieces 124c are patterned to provide parallel and aligned silicide paths in the drain diffusion region 130c. Otherwise, the other elements of the device 120c in FIG. 13 are the same as the elements of the device 120 in FIG. 5, and have the same numeral designations except that a "c" has been added to the numeral designations in FIG. 13. In particular, the non-silicide diffusion pieces 124c are arranged so that they are positioned side-by-side in a plurality of rows, and define parallel silicide paths 174c between each adjacent non-silicide diffusion piece 124c. These parallel silicide paths 174c can be substantially parallel to the channel width direction. The narrow, parallel paths 174c of the silicided portions create a resistance network to facilitate uniform turn on for the transistor 120c. These silicide paths 174c are also hereinafter referred to as "gaps".

Figure 14:
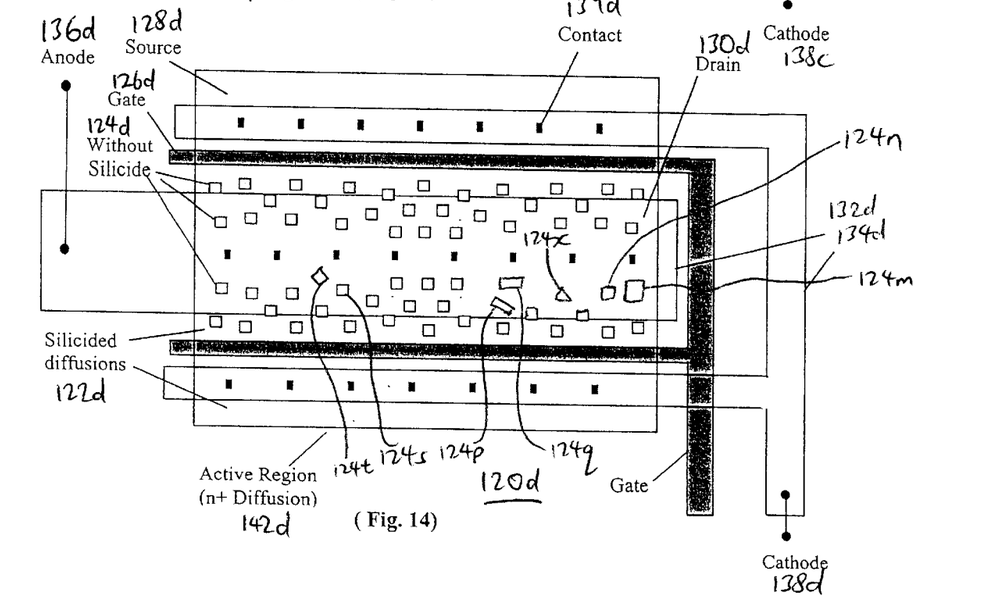

Referring next to FIG. 14, the semiconductor device 120d is essentially the same as the semiconductor device 120 of FIG. 5, except that the plurality of separate and individual non-silicide diffusion pieces 124d are positioned in an arbitrary pattern. Otherwise, the other elements of the device 120d in FIG. 14 are the same as the elements of the device 120 in FIG. 5, and have the same numeral designations except that a "d" has been added to the numeral designations in FIG. 14. In particular, the non-silicide diffusion pieces 124d are arbitrarily positioned throughout the drain diffusion region 130d. These non-silicide diffusion pieces 124d can have different sizes, shapes and orientations. By "orientation", it is meant that adjacent non-silicide diffusion pieces are positioned at an arbitrary angle to each other. For example, the pieces 124m and 124n have different sizes; the pieces 124p and 124q have different orientations; the pieces 124s and 124t also have different orientations; and the pieces 124x, 124q, 124t and 124n have different shapes. In addition, as shown in FIG. 14, the spacings between adjacent non-silicide diffusion pieces 124d can be varied.

Figure 16:
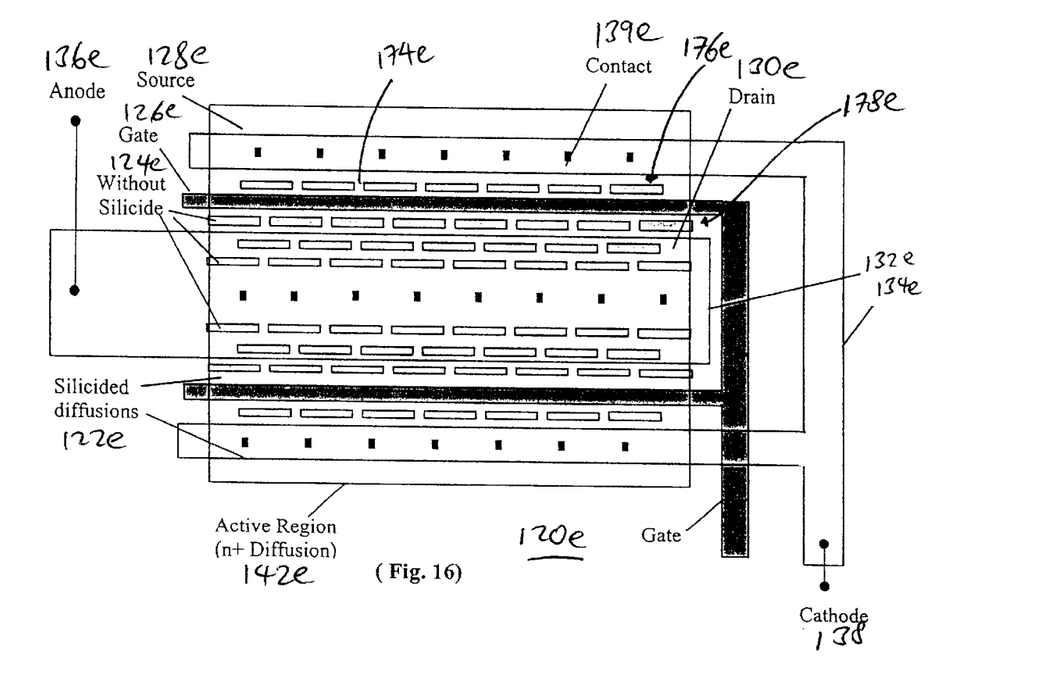

Referring now to FIG. 16, the semiconductor device 120e is essentially the same as the semiconductor device 120 of FIG. 5, except that a plurality of separate and individual non-silicide diffusion pieces 124e are also provided in the source diffusion region 128e. Otherwise, the other elements of the device 120e in FIG. 16 are the same as the elements of the device 120 in FIG. 5, and have the same numeral designations except that an "e" has been added to the numeral designations in FIG. 16. In particular, the non-silicide diffusion pieces 124e are now arranged on both sides of the gate 126e in both the drain diffusion region 130e and the source diffusion region 128e. As a non-limiting example, FIG. 16 illustrates one particular arrangement of these non-silicide diffusion pieces 124e on both sides of the gate 126e, in that the row 176e of non-silicide diffusion pieces 124e in the source diffusion region 128e adjacent the gate 126e, and the row 178e of non-silicide diffusion pieces 124e in the drain diffusion region 130e adjacent the gate 126e, are arranged so that the center of a diffusion piece 124e in one of the rows 176e or 178e is aligned with the silicide path 174e between two adjacent diffusion pieces 124e in the other row 178e or 176e. Such an arrangement helps to promote uniform ESD current flow across the gate 126e, for the reasons explained in U.S. Pat. No. 5,721,439 to Lin, whose disclosure is incorporated herein by this reference as though fully set forth herein.

Figure 17:
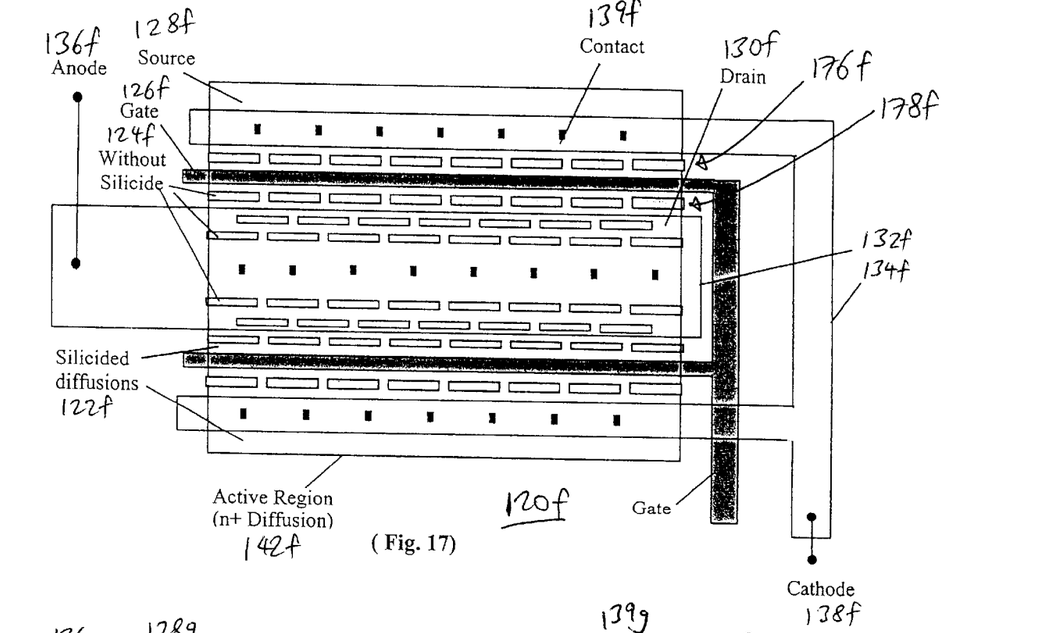
Figure 18:
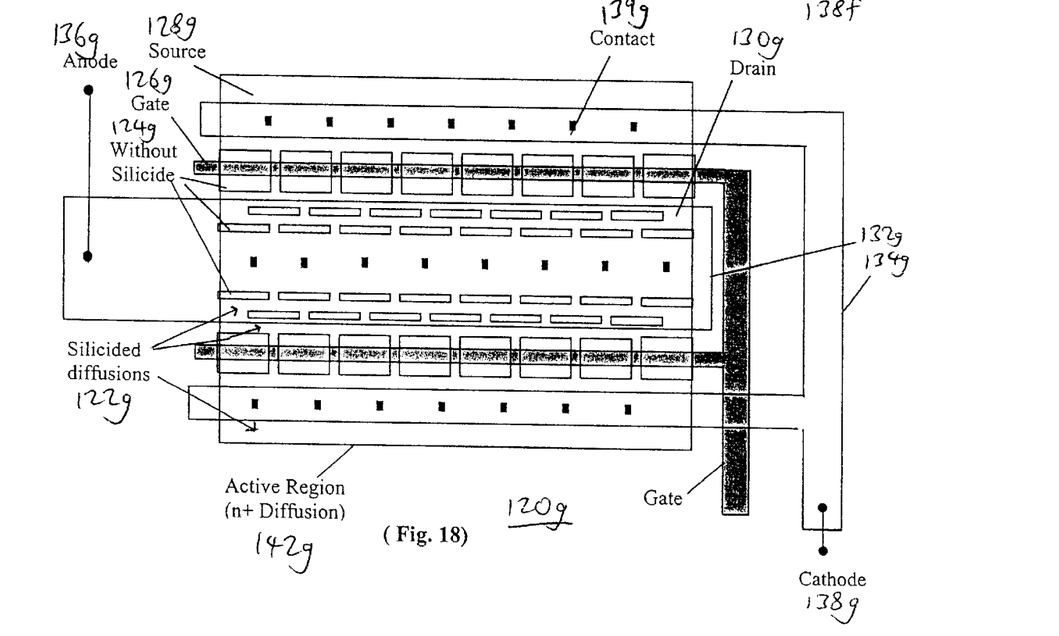

The semiconductor device 120f in FIG. 17 is essentially the same as the semiconductor device 120e of FIG. 16, except that the row 176f of non-silicide diffusion pieces 124f in the source diffusion region 128f adjacent the gate 126f, and the row 178f of non-silicide diffusion pieces 124f in the drain diffusion region 130f adjacent the gate 126f are arranged so that the centers of the diffusion pieces 124f in the rows 176f and 178f are substantially aligned with each other. Otherwise, the other elements of the device 120f in FIG. 17 are the same as the elements of the device 120e in FIG. 16, and have the same numeral designations except that an "f" is used to replace the "e" in the numeral designations in FIG. 17. The alignment and arrangement illustrated in FIG. 17 provides more direct low-resistance paths from the drain to the source, thereby minimizing the increase of resistance. Referring now to FIG. 18, the semiconductor device 120g is essentially the same as the semiconductor device 120f of FIG. 17, except that some of the plurality of separate and individual non-silicide diffusion pieces 124g can be adjacent to the gate 126g, and the poly gate 126g can also have at least one non-silicide portion. Otherwise, the other elements of the device 120g in FIG. 18 are the same as the elements of the device 120f in FIG. 17, and have the same numeral designations except that a "g" has been added to the numeral designations in FIG. 18. The alignment and arrangement illustrated in FIG. 18 provides design flexibility, and the silicide blocked portions do not necessarily have to be separate from adjacent the gate.

Figure 19:
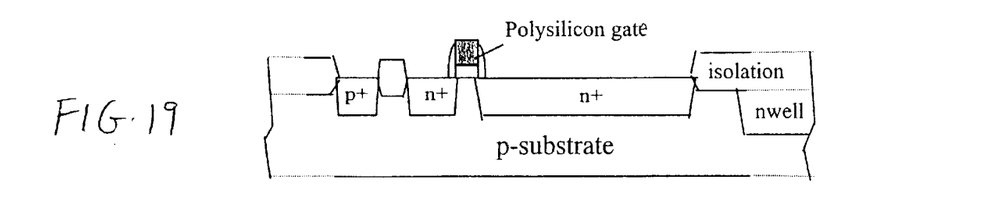
FIGS. 19–23 illustrate a process flow for creating a silicide block in a semiconductor device according to one embodiment of the present invention.
Figure 20:
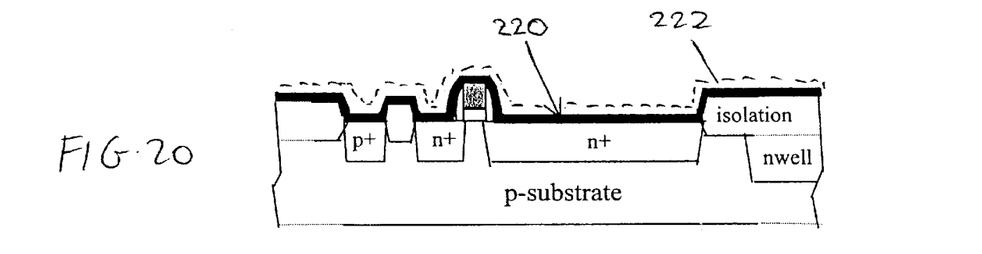
Figure 21:
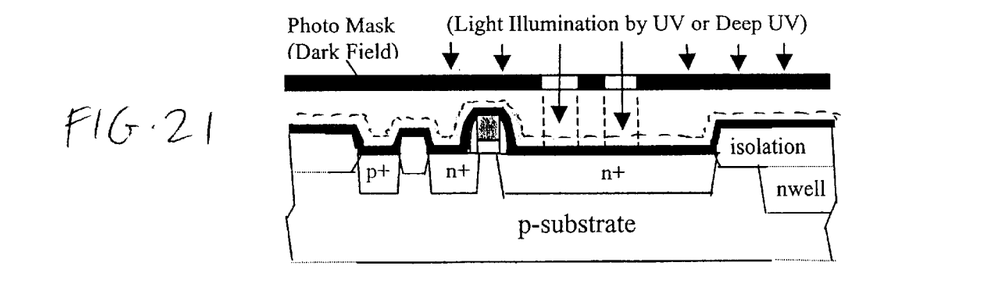

FIGS. 19–23 illustrate a process flow for creating a silicide block in a semiconductor device (such as a transistor). First, FIG. 19 illustrates the formation of a MOS transistor using conventional and well-known techniques that include well formation, field-oxide (or trench isolation) formation, poly formation and patterning, LDD implant, spacer formations, the n+ and p+ implants, and oxide dip. These processing steps define the transistor gate and the source/drain diffusion areas that are shown in FIG. 19. In the next step as illustrated in FIG. 20, a conductive layer 220 and a photoresist layer 222 are deposited over the device defined in FIG. 19. The conductive layer 220 is preferably a refractory metal, such as but not limited to titanium, cobalt, tungsten, nickel, platinum and palladium. Next, as illustrated in FIG. 21, a photo mask (which can be any of the masks 150, 152, 150a, 152a described above) is positioned over the device, and light is illuminated via ultraviolet or deep ultraviolet to pattern the desired non-silicided regions 124 by a photo-development process. As one example, the mask can be a silicide-block mask using a dark field.

Figure 22:
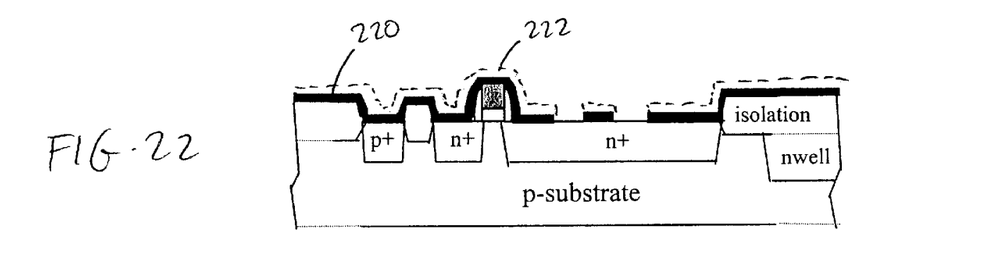
Figure 23:
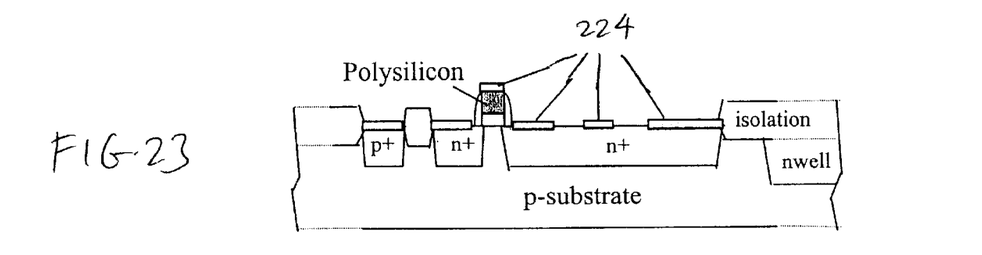

Next, as illustrated in FIG. 22, the conductive layer 220 is etched using a conventional dry or wet etch process. During this etching step, certain portions of the conductive layer that are not covered by the photoresist are removed to keep portions of the silicon and polysilicon surface free of metal at locations where no silicidation is needed. In the next step illustrated in FIG. 23, the photoresist 222 is lifted using conventional techniques, and a heat treatment is applied using known conventional techniques (e.g., rapid thermal process) to form the metal silicide 224 on certain portions of the silicon and polysilicon surface of the device. The silicide layer can be a titanium silicide, cobalt silicide or other silicide layer, depending on whether titanium, cobalt or other refractory metal is used. Thereafter, non-silicided metal (such as those portions on a spacer or on field-oxide or trench isolation) are removed using a metal etch process.

Figure 24:
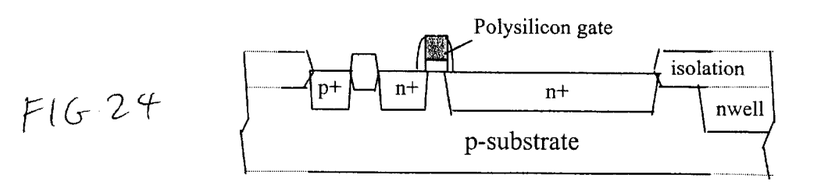
FIGS. 24–28 illustrate a process flow for creating a silicide block in a semiconductor device according to another embodiment of the present invention.
Figure 25:
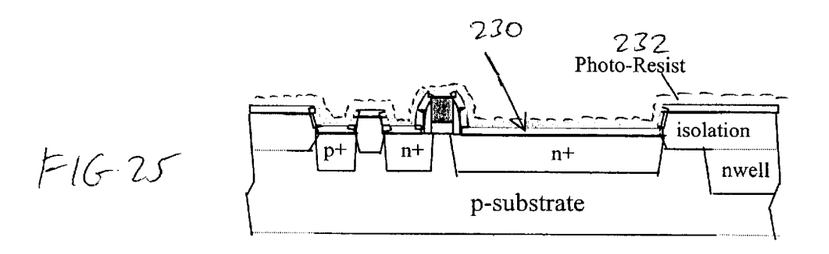
Figure 26:
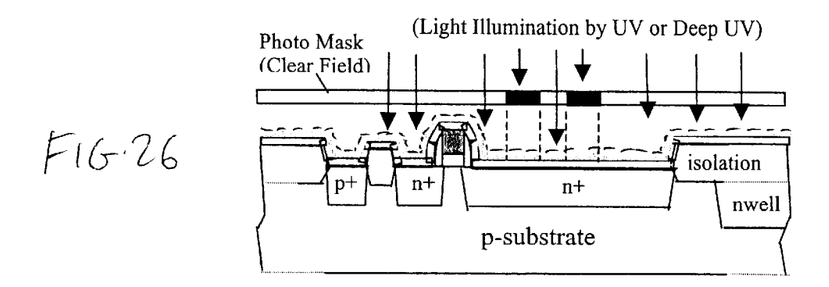

FIGS. 24–28 illustrate another process flow for creating a silicide block in a semiconductor device (such as a transistor). First, FIG. 24 illustrates the formation of a MOS transistor as in FIG. 19. In the next step as illustrated in FIG. 25, either oxidation is applied, or silicon oxide deposition is performed using CVD, to form a silicon oxide layer 230. A photoresist layer 232 is also deposited over the device defined in FIG. 24. The oxide is intended to cover portions of the silicon and polysilicon surface of the device where no silicidation is needed. Next, as illustrated in FIG. 26, a photo mask (which can be any of the masks 150, 152, 150a, 152a described above) is positioned over the device, and light is illuminated via ultraviolet or deep ultraviolet to pattern the desired non-silicided regions 124. As one example, the mask can be a silicide-block mask using a clear field.

Figure 27:
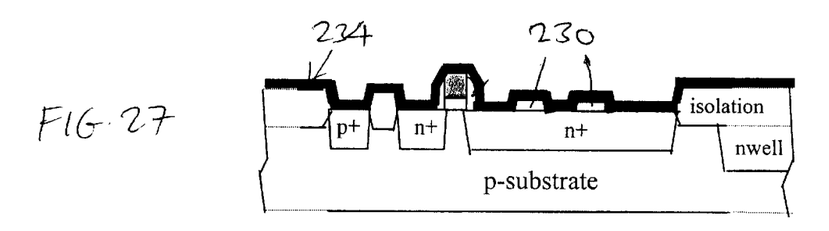
Figure 28:
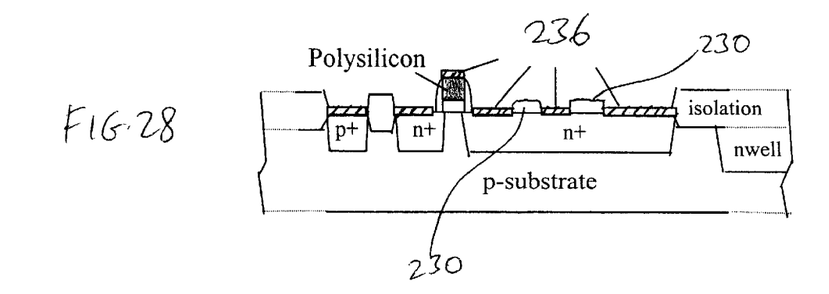

Next, as illustrated in FIG. 27, the photoresist 232 is patterned using conventional processes, and the oxide 230 is etched using conventional processes. A conductive layer 234 (which can be the same material as for the conductive layer 220 in FIGS. 19–23) is then deposited on top of all the elements of the wafer. In the next step illustrated in FIG. 28, a heat treatment is applied (e.g., using rapid thermal anneal or RTA) to form the metal silicide 236 on certain portions of the silicon and polysilicon surface of the device. Thereafter, non-silicided metal (such as those portions on silicon oxide layer 230, on a spacer, or on field-oxide or trench isolation) are removed by a conventional metal etch process.

The present invention provides numerous important advantages in the fields of silicide processing and ESD protection. First, the present invention provides flexibility in using a silicide (or salicide) block processing with far less degree of drain resistance increase. This is due to the existence of low-resistance paths from a drain contact to near the gate (channel) edge. For example, it is known that the silicide block region has an n+ sheet resistance of around 40 ohms per square, while a non-silicided blocked region has a much lower silicide sheet resistance of around 2 to 3 ohms per square. The narrow detouring silicide paths (e.g., 174c in FIG. 13) from the drain contact to the gate edge that are formed between the respective non-silicided diffusion pieces 124 in the present invention create a lower resistance path. This resistance path has a much lower resistance than the resistance paths in FIG. 1, which provide conventional non-silicided regions across the entire width of the drain region 30, thereby not allowing low resistance paths to travel from the drain contacts to the gate edge.

Second, the semiconductor devices that utilize the silicide processing of the present invention are useful for high speed (e.g., input, output, I/O) applications because the resistance of drain contact to the gate edge is reduced when compared with the conventional silicide-blocking device of FIG. 1.

Third, the combination and arrangement of the first and second resistance portions greatly improve ESD protection performance by providing fast ESD triggering and uniform ESD current distribution.

Fast ESD triggering of an NMOS ESD protection device according to the present invention is achieved because the initial ESD current flowing from the drain contact through the low-resistance suicide paths (e.g., 174c) can arrive at the gate edge very quickly. This is beneficial for faster triggering of the ESD device.

Uniform ESD current distribution is important because after the ESD device is triggered, full and uniform activation of the ESD device is important for ESD performance. Uniform ESD current distribution is achieved because the large ESD current flows partly through the ultra low silicided-diffusion-region resistivity paths mentioned above (i.e., the low-silicided diffusion-region is the non-silicided blocked region), and flows partly from the drain contact region towards the gate edge region through the higher resistance silicide blocked regions (i.e., the high resistance regions are the silicide blocked regions). These two current flow paths combine to form a more uniform distributed resistance to enhance the full and uniform activation of the entire ESD protection device.

Fourth, the principles of the present invention can be implemented in a very simple manner because only the change of one mask (e.g., 150, 152, 150a, 152a) is needed to improve ESD and (input, output, I/O) speed. For example, to change the device 20 shown in FIG. 1 to the device 120 shown in FIG. 5, one only needs to change one silicide-block mask (e.g., from 50 or 52 to 150 or 152). As a further example, to change the device 120 shown in FIG. 5 to another device (e.g., 120e of FIG. 16), one only needs to change another silicide-block mask. Thus, all the processing steps can remain the same, except that a different mask is selected and used.

It will be appreciated by those skilled in the art that the principles illustrated in FIGS. 5–14 can also be applied to the embodiments in FIGS. 16–18.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A semiconductor device, comprising:
   a first diffusion region having a silicided portion and a non-silicided portion;
   a second diffusion region;
   a channel region between the first and second diffusion regions; and
   wherein the non-silicided portion has a plurality of separate non-silicided regions.

2. The device of claim 1, wherein the plurality of non-silicided regions define at least one silicided path between adjacent non-silicided regions.

3. The device of claim 2, wherein each silicided path extends from a first area that is adjacent to the channel region to a second area that is positioned more remotely from the channel region than the first area.

4. The device of claim 3, further including a contact positioned in the second area.

5. The device of claim 2, wherein at least some of the at least one silicided path are parallel to each other.

6. The device of claim 1, wherein the plurality of non-silicided regions are arranged in separate rows.

7. The device of claim 1, wherein the plurality of non-silicided regions are arranged in an arbitrary manner.

8. The device of claim 1, wherein at least one of the plurality of non-silicided regions has a square configuration.

9. The device of claim 1, wherein at least one of the plurality of non-silicided regions has a rounded configuration.

10. The device of claim 1, wherein the plurality of non-silicided regions have at least two different sizes.

11. The device of claim 1, wherein the plurality of non-silicided regions have at least two different shapes.

12. The device of claim 1, wherein the plurality of non-silicided regions have at least two different orientations.

13. The device of claim 1:
wherein the silicided portion of the first diffusion region is a first silicided portion and the non-silicided portion of the first diffusion region is a first non-silicided portion;
wherein the second diffusion region has a second silicided portion and a second non-silicided portion; and
wherein the second non-silicided portion has a plurality of separate non-silicided regions.

14. The device of claim 13, wherein the plurality of non-silicided regions in second non-silicided portion define at least one silicided path between adjacent non-silicided regions in the second non-silicided portion.

15. The device of claim 14, wherein at least some of the at least one silicided path are parallel to each other.

16. The device of claim 13, wherein the center of at least one non-silicided region of the first non-silicided portion adjacent the channel region is aligned with the center of at least one non-silicided region of the second non-silicided portion adjacent the channel region.

17. The device of claim 14, wherein the center of at least one non-silicided region of the first non-silicided portion adjacent the channel region is aligned with a silicide path between adjacent non-silicided regions of the second non-silicided portion adjacent the channel region.

18. The device of claim 1, further including a gate structure over the channel region.

19. The device of claim 18, wherein the gate structure comprises a polysilicon layer with a silicided surface.

20. The device of claim 18, wherein the gate structure comprises a polysilicon layer without a silicided surface.

21. The device of claim 1, wherein the first diffusion region is coupled to a first IC pad, and the second diffusion region is coupled to a second IC pad.

22. The device of claim 1, wherein the first diffusion region is coupled to a first IC pad, and the second diffusion region is coupled to a power bus.

* * * * *